United States Patent [19]
Plesko

[11] Patent Number: 5,933,288
[45] Date of Patent: Aug. 3, 1999

[54] PROXIMITY SWITCH SYSTEM FOR ELECTRONIC EQUIPMENT

[75] Inventor: George A. Plesko, Media, Pa.

[73] Assignee: GEO Labs, Inc., Media, Pa.

[21] Appl. No.: 09/004,941

[22] Filed: Jan. 9, 1998

Related U.S. Application Data

[63] Continuation-in-part of application No. 08/854,810, May 12, 1997, Pat. No. 5,831,261, and a continuation-in-part of application No. 08/977,021, Nov. 24, 1997, Pat. No. 5,870,219, which is a division of application No. 08/785,793, Jan. 20, 1997, Pat. No. 5,691,834, which is a division of application No. 08/332,629, Oct. 31, 1994, Pat. No. 5,596,446.

[51] Int. Cl.$^6$ .................................................. G02B 26/08
[52] U.S. Cl. ..................... 359/896; 250/221; 359/196; 235/462; 235/472
[58] Field of Search ............................. 250/221, 227.22, 250/222.1; 235/467, 470, 472, 462; 359/896, 196

[56] References Cited

U.S. PATENT DOCUMENTS 5,103,085  4/1992  Zimmerman ............................. 250/221
5,397,890  3/1995  Schueler et al. ......................... 250/221
5,541,397  7/1996  Walts ....................................... 250/221

OTHER PUBLICATIONS

James Dunn, "Reconfiguring a Capacitive Proximity Sensor for Difficult Mounting Applications," *Sensors*, Dec. 1997, vol. 14, No. 12, pp. 52–53.

*Primary Examiner*—James Phan
*Attorney, Agent, or Firm*—Reed Smith Shaw & McClay LLP

[57] ABSTRACT

An externally operable electronic switch which is entirely located within a housing but which is in no way mechanically or physically attached to the inside or the outside of the housing, has no moving parts, nothing to wear out, requires no holes or special treatments to the housings of equipment into which it may be incorporated and has no optical parts to fog or become dirty which could lead to unreliable operation is disclosed. The switch is operated without mechanical force. It is unnecessary to touch anything to operate it and it consumes extremely low stand by power. It is suited for sealed and portable battery operated equipment.

30 Claims, 8 Drawing Sheets

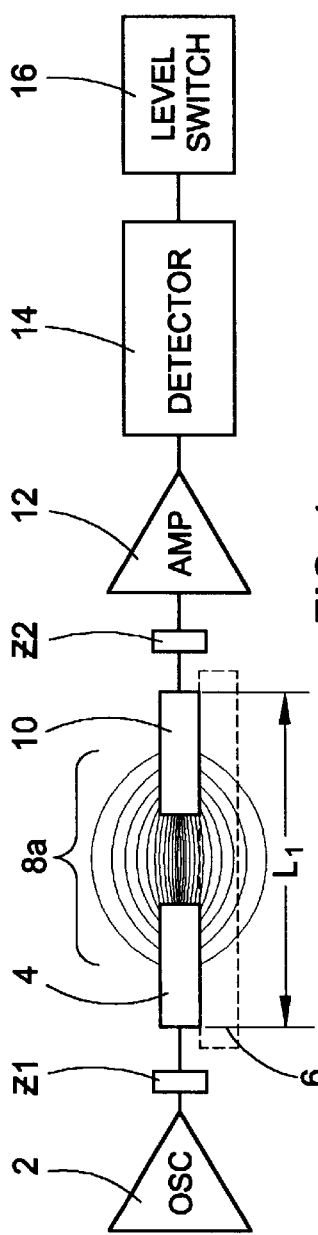
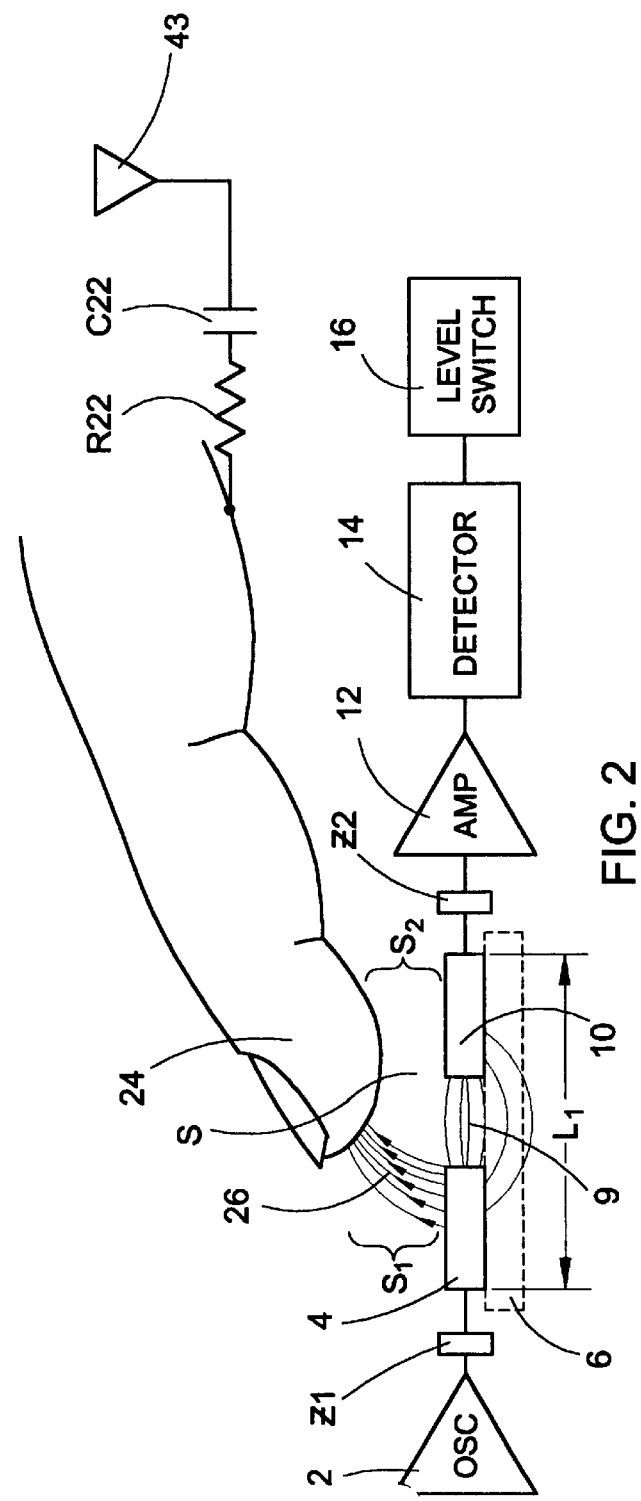

PROXIMITY SWITCH SYSTEM FOR ELECTRONIC EQUIPMENT

CROSS-REFERENCE TO RELATED APPLICATIONS

The present application is a continuation-in-part of U.S. Application Ser. No. 08/977,021, filed Nov. 24, 1997, now U.S. Pat. No. 5,870,219 which is a divisional of U.S. Application Ser. No. 08/785,793, filed Jan. 20, 1997, U.S. Pat. No. 5,691,834, which is a divisional of U.S. Application Ser. No. 08/332,629, filed Oct. 31, 1994, U.S. Pat. No. 5,596,446. The present application is also a continuation-in-part of U.S. Application Ser. No. 08/854,810, filed May 12, 1997, U.S. Pat. No. 5,831,261.

BACKGROUND OF THE INVENTION

In recent years battery powered portable electronic equipment has been rapidly growing in popularity. A great deal of such equipment is used for gathering, storing and processing information. The information must first be sensed then processed, and stored for future use. Equipment such as barcode readers, portable computers, medical equipment and electro-optical equipment are but a few examples. Cordless electronic power tools are also in great demand because of the great convenience they afford.

Electronic equipment such as, for example, laser scanning barcode readers, contain miniature precision optical components such as mirrors, lenses, optical filters and high sensitivity electronic circuits. Any moisture, condensation, or small particulate material such as smoke or dust can fog and degrade the optics as well as internal electronics when used in outdoor or industrial environments if the equipment housing is not well sealed.

In designing portable electronic equipment, two major considerations include how such portable equipment is packaged and how it is turned on and off in order to operate it. An external switch mounted on the housing of the equipment is the usual method of turning the equipment on and off. This solution, however, leads to many other problems and high cost as will be shown.

External mechanical switches require force to operate and lead to operator fatigue. Openings in the equipment housings are required to link the external mechanical parts of the switch mechanisms to the equipment inside of the housing thus leading to additional drawbacks that relate to sealing of the housing. Sealing portable equipment for durability in harsh outdoor environments adds additional expense, raises the parts count, introduces complexity and reduces equipment reliability. The mechanical linkages needed to actuate traditional external mechanical switch mechanisms coupled with internal electromechanical switch mechanisms themselves can wear out, freeze up, break, bind, become unreliable when moisture or dirt gets into them and so on leading to a wide variety of failures.

The housings of portable electronic equipment are commonly made from plastic moldings and incorporate openings into such moldings to accommodate external switch mechanisms, thereby increasing tooling costs.

Thus, it is desirable for such portable equipment to have certain general characteristics. Among these are low power drain and short operation cycle time for long battery life, ease of actuation, ease of operation to minimize operator fatigue, durability especially for use in harsh and outdoor environments and of course low cost. The switch mechanisms used to operate such equipment can greatly influence the quality of these characteristics.

Discussion of Prior Art

Certain types of switches operating on capacitive effects are well known. For example, capacitive switches have been used on elevator selection panels but these must be touched to operate. Other types of non-mechanical capacitive switches are described in the literature which couple external noise picked-up by the body and introduce it into electronic switching circuits by means of touch or contact plates are well known. Switches operating on phase shift principles which depend on human body capacitance have been used to operate electronic keyboards but these also require contact plates. A book entitled CMOS Cookbook by Don Lancaster and published by the Sams publishing company describes numerous non-mechanical proximity switches but none operate over the range of distance and without dependence on actual touch plates as do the embodiments of the present invention which are described herein.

Objects of the Invention

It is therefore a general object of the present invention to provide a completely internally housed electronic switch for turning on and off electronic equipment from outside the equipment housing by an operator as desired, wherein the switch operates without any opening in the equipment housing whatsoever and requires no special treatment of the housing wall for its operation.

It is another object of the present invention to provide an externally operable electronic switching system which is entirely located within a housing and which has no moving parts, nothing to wear out and no optical parts to fog or become dirty which could lead to unreliable operation.

It is a further object of the present invention to provide an externally operable electronic switching system for operating equipment which is located within an equipment housing and which requires extremely low stand buy power for long battery life.

Yet another object of the present invention is to provide an externally actuated, internally housed entirely electronic switching system for turning equipment on and off without having to come into physical contact with anything and requiring no mechanical forces for actuation thereof.

It is still a further object of the present invention to show how the inventive capacitive switching systems described herein may be used to ergonomically enhance electronic equipment such as bar code readers by reducing fatigue associated with traditional mechanical switch mechanisms.

The invention itself, however, both as to its construction and its method of operation, together with additional objects and advantages will be best understood from the following description of specific embodiments when read in connection with the accompanying drawings, and the claims.

BRIEF DESCRIPTION OF THE DRAWINGS

FIG. 1 shows a schematic circuit of a non-contact, capacitively actuated switching circuit of the present invention.

FIG. 2 shows how electromagnetic energy is diverted by a finger when brought into a non-contacting relationship with elements of the circuit of FIG. 1 in order to effect a change of state of the level switch output of the circuit.

FIG. 5A shows an enlarged view of the mounting and operating details of the sensing elements of FIG. 5.

FIG. 6A shows an enlarged detail of a portion of FIG. 6 in which the sensing conductors and electromagnetic fields are interacting through an insulated housing with the operator's finger to turn the reader on.

DETAILED DESCRIPTION OF THE INVENTION

Figure 3:
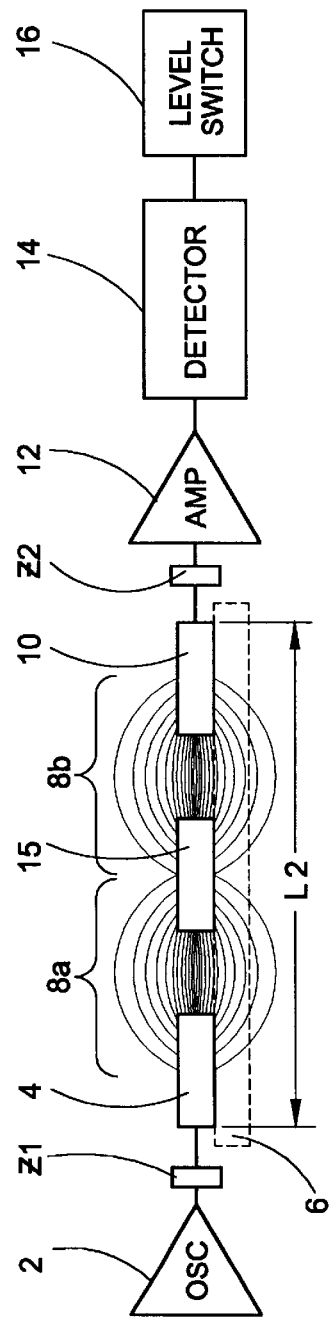
FIG. 3 shows a circuit similar to that of FIG. 1 but adapted to have a greater linear range of sensitivity than those of FIGS. 1 and 2.

Referring to FIG. 1, there is shown a system diagram for the novel non-contact switching mechanism of the present invention. In this embodiment, oscillator 2 is set up to run at a frequency which would be considered a radio frequency. Frequencies from several hundred Khz to a few Mhz have been found to work well. The type of oscillator chosen is not special, although the oscillator should be stable in output voltage but need not have a high degree of frequency stability. Such an oscillator may be inexpensively constructed from a single low power CMOS Schmitt inverter 60, one capacitor and a resistor to form an astable multivibrator. The output of oscillator 2 is coupled to conductor 4 through impedance coupling element Z1. Typically Z1 is a high impedance device such as a small capacitor or large resistor or both in series and serves to limit the output power of oscillator 2.

Conductors 4 and 10 are typically attached to the surface of a non-conductive substrate or carrier 6 which may be a circuit board upon which a portion of, or the entire circuit of FIG. 1 is built.

In one embodiment, conductors 4 and 10 are made from copper foil about one-eighth inch to one-half inch long, are about one-sixteenth inch wide and separated by a distance of approximately three-sixteenths of an inch.

Conductor 10 is connected through impedance element Z2 to high frequency amplifier 12. Amplifier 12 is preferably constructed with amplifiers which consume low stand-by power. CMOS amplifiers connected in series to yield a gain of 60 db were found to work well. Amplifier 12 should have a stable constant gain in the frequency range of oscillator 2.

As shown in FIG. 1, a very weak electromagnetic field emanates from conductor 4 and is picked up by conductor 10 as depicted by field lines 8a and the signal received by conductor 10 is amplified by amplifier 12. The amplified AC signal at the output of amplifier 12 is then detected and converted to a DC level by detector 14 which may be constructed from a silicon signal diode, a small capacitor and a bleed down resistor in parallel with the small capacitor. Such detectors are common in radio circuits. The resultant DC level from detector 14 is then fed into level switch 16. A comparator circuit, preferably made from low power CMOS components is ideally suited to perform the function of level switch 16. When the output 17 of level of switch 16 changes state, it electronically turns on and off whatever device is operatively connected to its output.

In order to change the state of level switch 16 shown in FIG. 1, conductive object 24 is brought near (but not in contact with) conductors 4 and 10 along length L1 in the vicinity of the gap between them as shown in FIG. 2. In this case conductive object 24 is a person's finger. The human body may be modeled as a resistance R22 in series with a capacitor C22. Capacitor C22 is typically modeled as 100 picofarads (pf) to 300 pf and resistance R22 is on the order of a few hundred to a few thousand ohms but is unimportant in this application since movement of a person's finger is so much slower than the RC time constant associated with R22 and C22.

By placing one's finger about one-fourth inch or less from, but not in contact with, conductors 4 and 10, the capacitance between the body and conductor 4 is very small and has been calculated to be on the order of several hundredths of a picofarad. As small as this value is, it has been found to be sufficient to affect stable and reliable operation of the present invention.

When a conductor such as person's finger 24 is brought into the space S near conductors 4 and 10 in the vicinity of space S, a portion of the electric field energy emanating from conductor 4 is coupled to conductive finger 24 as depicted by field lines 26 by means of the small capacitance from finger 24 to at least one of conductors 4 and 10 whereupon this coupled energy is radiated by the conductive finger and body to ground and surrounding space. (The body acts as antenna 43.) Thus, conductor 10 receives less electromagnetic energy through gap 9 between conductors 4 and 10 as shown in FIG. 2 than when finger 24 is not present as in FIG. 1.

When conductor 10 receives less electromagnetic energy, the signal output amplitude of amplifier 12 is lowered causing detector 14 to charge to a lower voltage, so that when the output of detector 14 falls sufficiently, the trip level of level switch 16 is reached causing the output of level switch 16 to change state. An internally set trip level of course is adjusted to occur when a person's finger is brought close to but not into contact with either conductor 4 or 10. (Unlike other capacitively coupled switch mechanisms employing touch plates, it is not desirable to touch the conductors 4 or 10 of the circuits described herein. Doing so forms a conductive path between them and raises rather than lowers the output of amplifier 12.)

It has been found that level switch 16 may be set to reliably trip and change state when a person's finger is brought into the range of one-half of an inch or less for the size and spacing of conductors 4 and 10 described above. This trip distance is adequate for turning on and off portable equipment through an insulated housing such as a plastic housing on many types of portable equipment so that an operator does not have to exert any force or touch any part of the circuit. The switch has been found to be most ergonomic if the trip point of level switch 16 is reached when a person's finger comes to within about one thirtysecond of an inch of the outside of a device's housing such as area 32 of device housing 30 shown in FIG. 5A.

It should be noted here that impedance elements Z1 and Z2 are both optional in that the circuits of FIGS. 1, 2, 3 and 4 will work without discrete components for Z1 and Z2. The output of oscillator 2 may be connected directly to conductor 4. Whereas conductor 10 may be connected directly to amplifier 12. It has also been discovered that properly sized gaps may be substituted for either or both Z1 and Z2 depending on the required distance in the vicinity of space S between brackets S1 and S2 of FIG. 2 for effective state changing of level switch 16. (It is realized that small gap between two conductors represents a small capacitance.)

Figure 9:
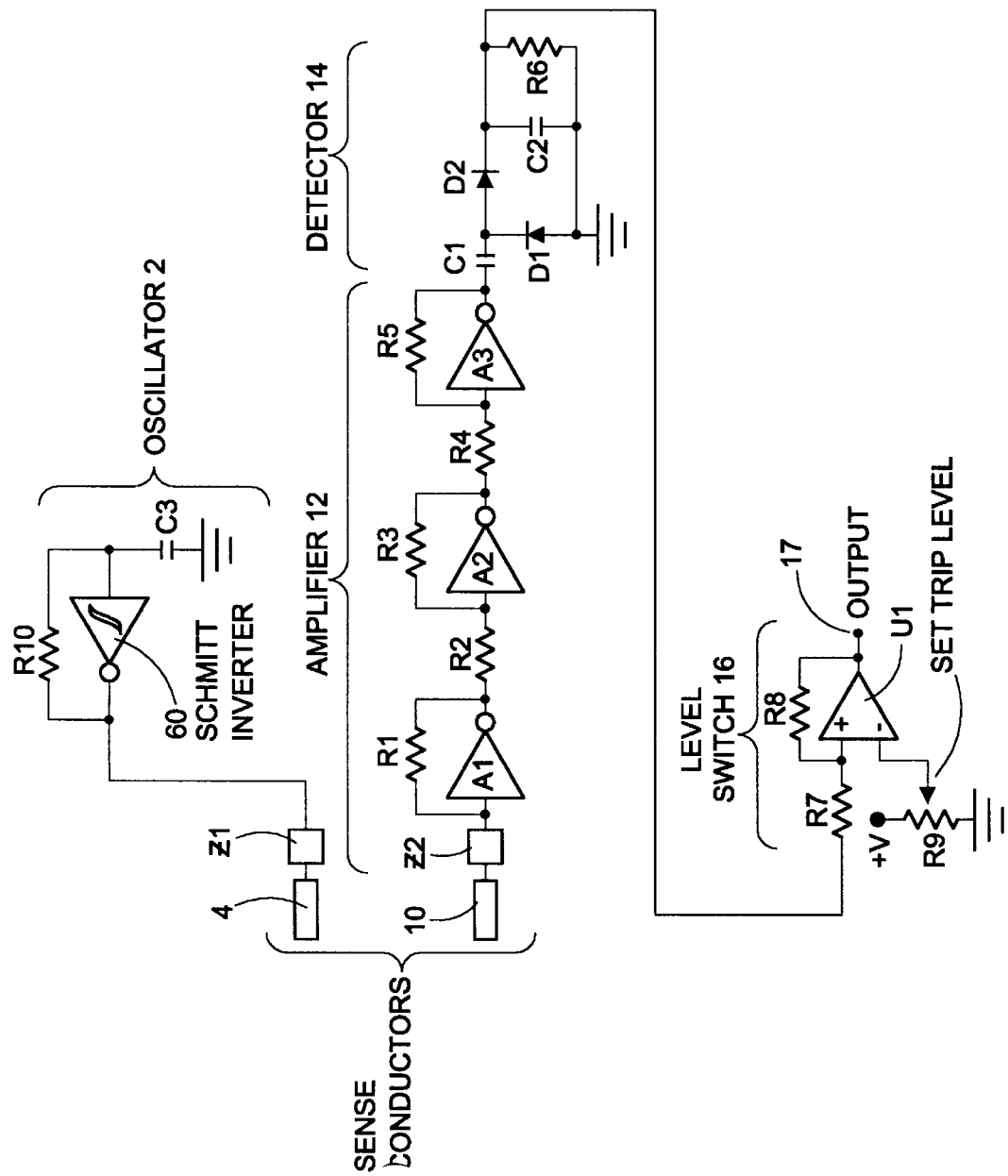
FIG. 9 shows a detailed example of a preferred implementation for the circuits of FIGS. 1 and 3.

When suitable low power CMOS components are used to implement the circuits of FIGS. 1 and 2 the power required to operate them is on the order of microamps and the energy radiated by the body when operating them is very small. The upper limit of the radiated energy of the entire circuit has been calculated to be on the order of one to one-tenth nanowatt. Details of one such circuit are shown in FIG. 9.

Extended Range Operation

Figure 4:
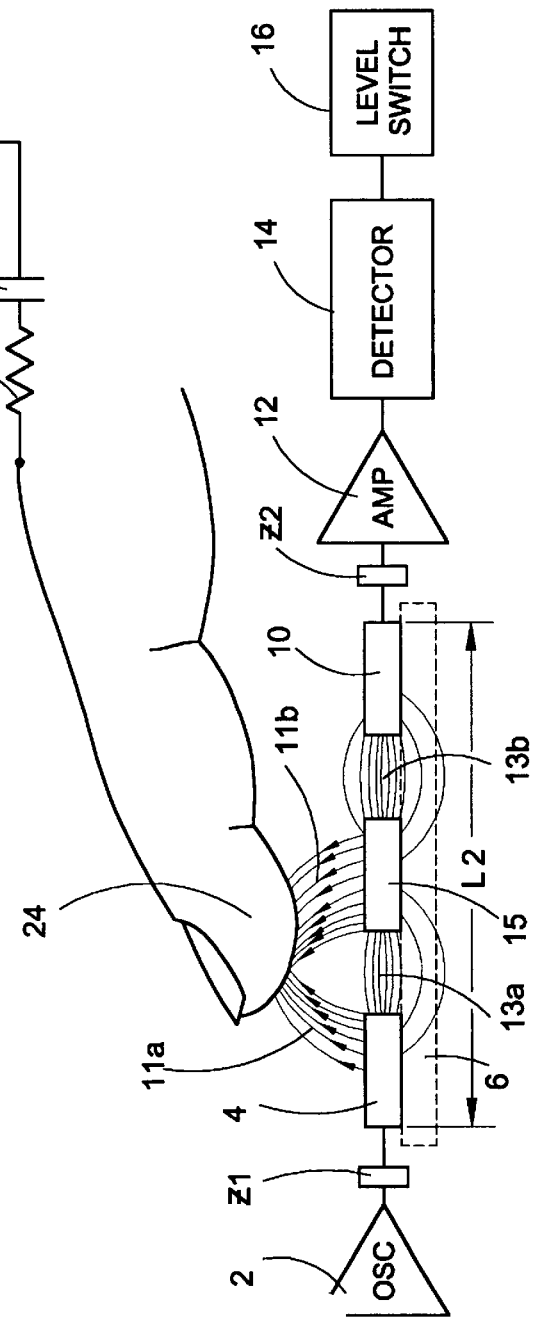
FIG. 4 shows how the circuit of FIG. 3 is made to change output state in a manner similar to that of FIG. 2.

The operation of the circuits shown in FIGS. 3 and 4 are indentical to those of FIGS. 1 and 2 except that passive conductor 15 has been added between conductors 4 and 10. The addition of passive conductor 15 if sized and spaced appropriately from conductors 4 and 10 can increase the distance sensitivity of the capacative coupling interaction between electromagnetic fields 8a and 8b transmitted between conductors 4 and 10 across gaps 13a and 13b and the portion intercepted by finger 24 as depicted by field lines 11a and 11b, especially with respect to length L2 along which conductive finger 24 may be placed to operate the capacitively coupled switch of the present invention.

Position and Shape of Sensing Conductors

Sensing conductors 4 and 10 as depicted in FIGS. 1, 2, 3 and 4 can be as thin as desired and do not have to lie flat on substrate 6. They may be raised vertically for example. FIG. 6A shows an alternate mounting scheme for conductors 4 and 10 in which they are arched. This configuration works well and is especially useful where it is not convenient to mount a circuit board with flat conductors in close proximity to or in contact with the inside of housing walls 32 and 33 as shown in FIGS. 5, 5A, 6 and 6A. It has also been discovered that by placing one's finger near only oscillator conductor 4, that the system of figure operates as intended.

Packaging and Operation

Figure 5:
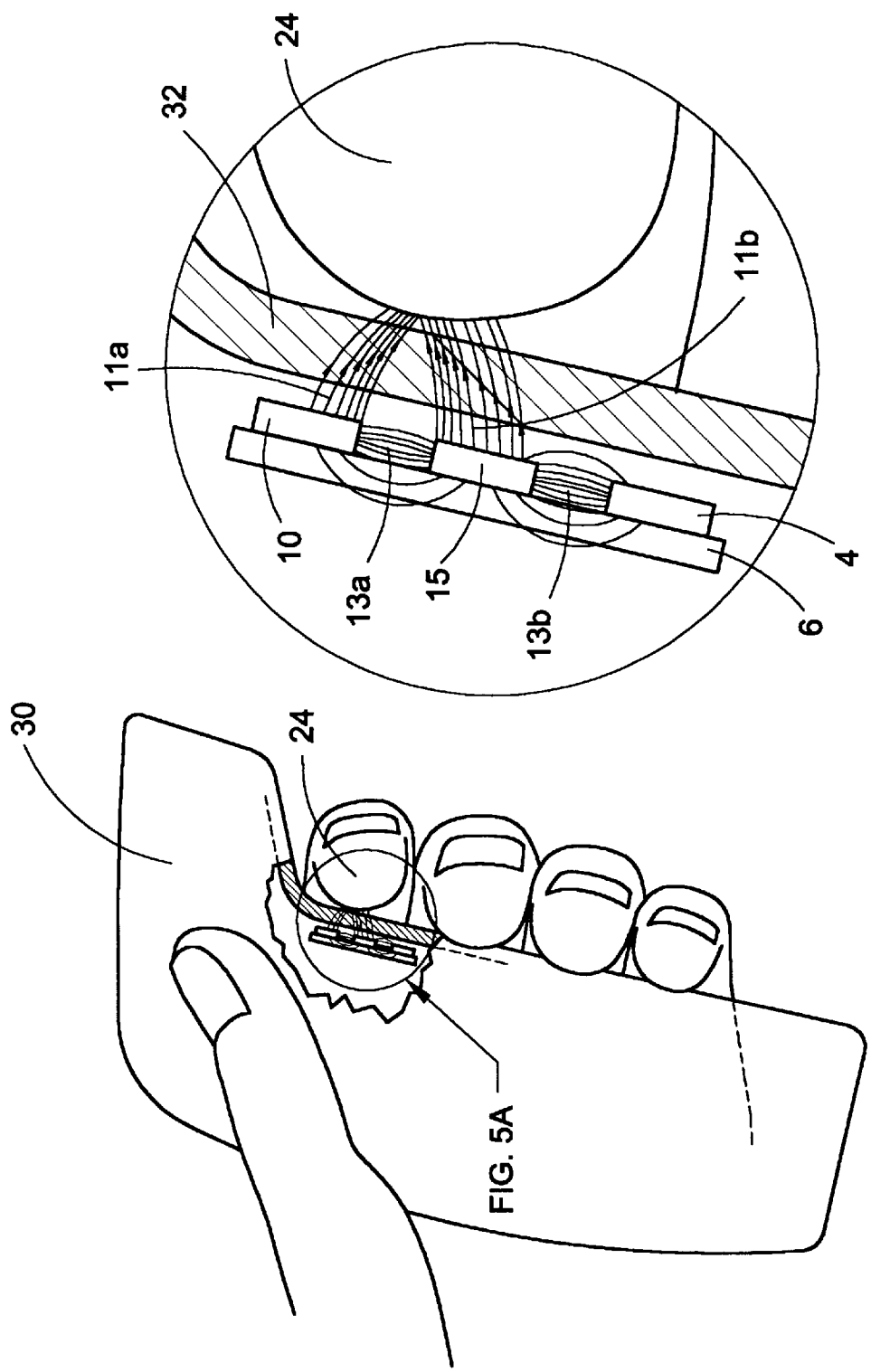
FIG. 5 shows how sensing elements of the switching circuit of the present invention may be completely internally housed and used to manually operate a product such as a bar code reader with no external means on the housing of the product and no moving mechanical parts.
Figure 6:
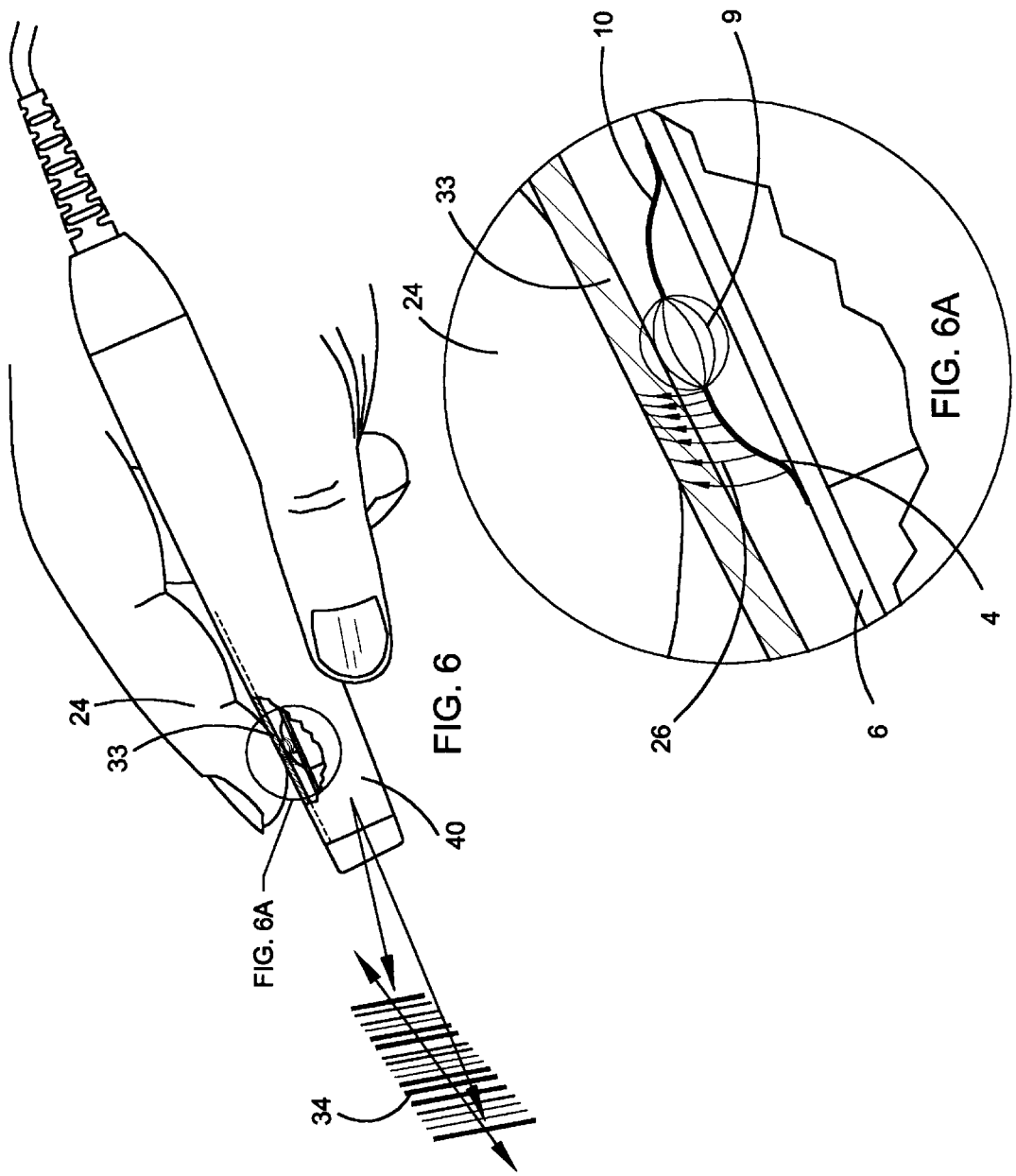
FIG. 6 shows how an embodiment of the non-mechanical internal switching circuit of the present invention may be adapted to manually operate a hand holdable bar code reader to read bar code 34, without the need for any external means on the housing and without the need to apply fatigue producing force.

FIGS. 5 and 5A show a generalized product having a gun-shaped housing 30, preferably made from plastic, which is turned on or off as desired by movement of conductive finger 24 towards or away from housing wall 32. A portable bar code reader in a wand-shaped housing 40 such as shown in FIGS. 6 and 6A is admirably suited for operation with the switching systems depicted in FIGS. 1, 2, 3, 4 and 7. Also the generalized housing of FIG. 5 may be that of a bar code reader or other device benefiting from the features of the present inventive switch in that it may be operated with virtually no effort, by simply sliding ones finger onto the area over which the switch resides inside of the housing case, and it may be sealed against all forms of contamination and moisture.

Other examples of products which may be actuated by the switch of the present invention include are portable thermometers, infrared thermometers, portable lights, electric drills, or equipment which is preferably sealed against moisture, or sealed so that it is intrinsically safe to operate in explosive fume environments and so on.

The switching effect which occurs by moving finger 24 close to conductors 4 and 10 is operative even if finger 24 is covered by a rubber glove or even covered by a metalized or conductive material since the space between finger 24 and conductors 4 and 10 or 4, 15 and 10 is typically insulated by air and finger 24 and the conductors are capacitively coupled to conductive finger 24. Also conductor 24 effecting such switching need not be a conductive finger, it may be another body part or any kind of conductor. A piece of metal of only a few square inches in area has been found sufficient to effect switching when positioned close to conductors 4 and 10.

FIGS. 6 and 6A depict a wand or pen shaped bar code scanner which is easily and ergonomically operated without the need of an external mechanical switch. It will be recognized by one skilled in packaging electronic products that the incorporation of external switches is not always a trivial design challenge. However, incorporation of the inventive switch mechanism of the present invention, especially into portable equipment such as that depicted in FIGS. 5 and 6, is greatly simplified and cost reduced since external parts such as holes, mechanical linkages and special seals are eliminated from the housings of such equipment.

Increased Sensitivity and Timed Operation

Figure 9A:
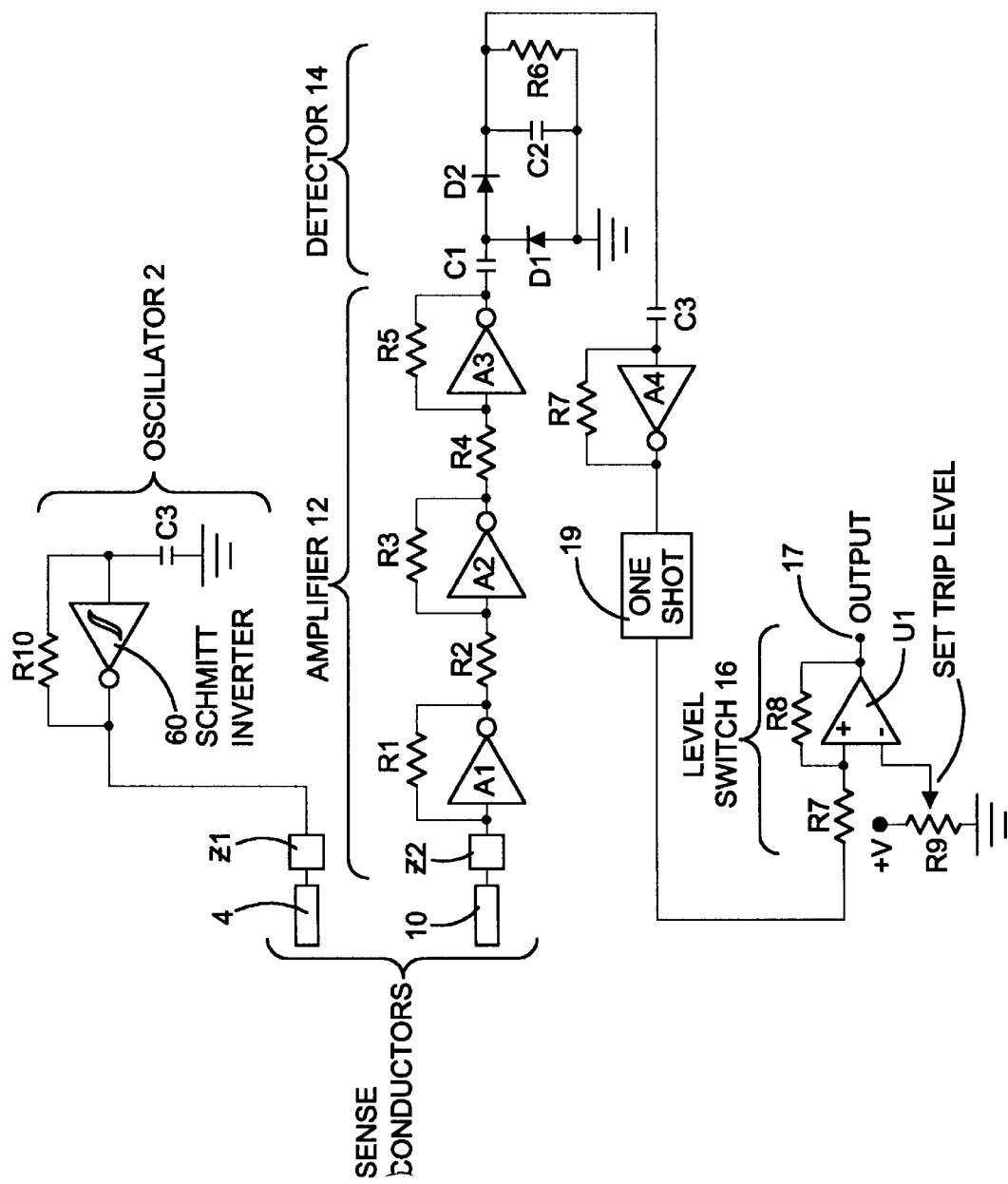
FIG. 9A shows a circuit similar to that of FIG. 9, but configured to detect movement at a distance.

For the circuits of FIGS. 1, 2, 3, 4 and 9 and modes of operation depicted in FIGS. 5, 5A, 6 and 6A, a particular switch state is maintained (the steady state mode) when a conductive element such as a finger is brought into close proximity to conductors 4 and 10 for example and held there. But another mode of operation is also useful and can be made even more sensitive: the motion detection mode. To implement the motion detection mode, an AC coupled amplifier A4 is attached to the output of the level switch as shown in FIG. 9A. Such amplifiers can differentiate a signal so they become responsive only to and produce an output a signal pulse corresponding to a change in level. This pulse is then amplified and is used to operate a one shot circuit 19, a momentary contact circuit or a time out circuit. This mode has been found to be very useful and responsive to very small movements of a conductor or a person's finger as the case may be.

Long Range Operation

Figure 7:
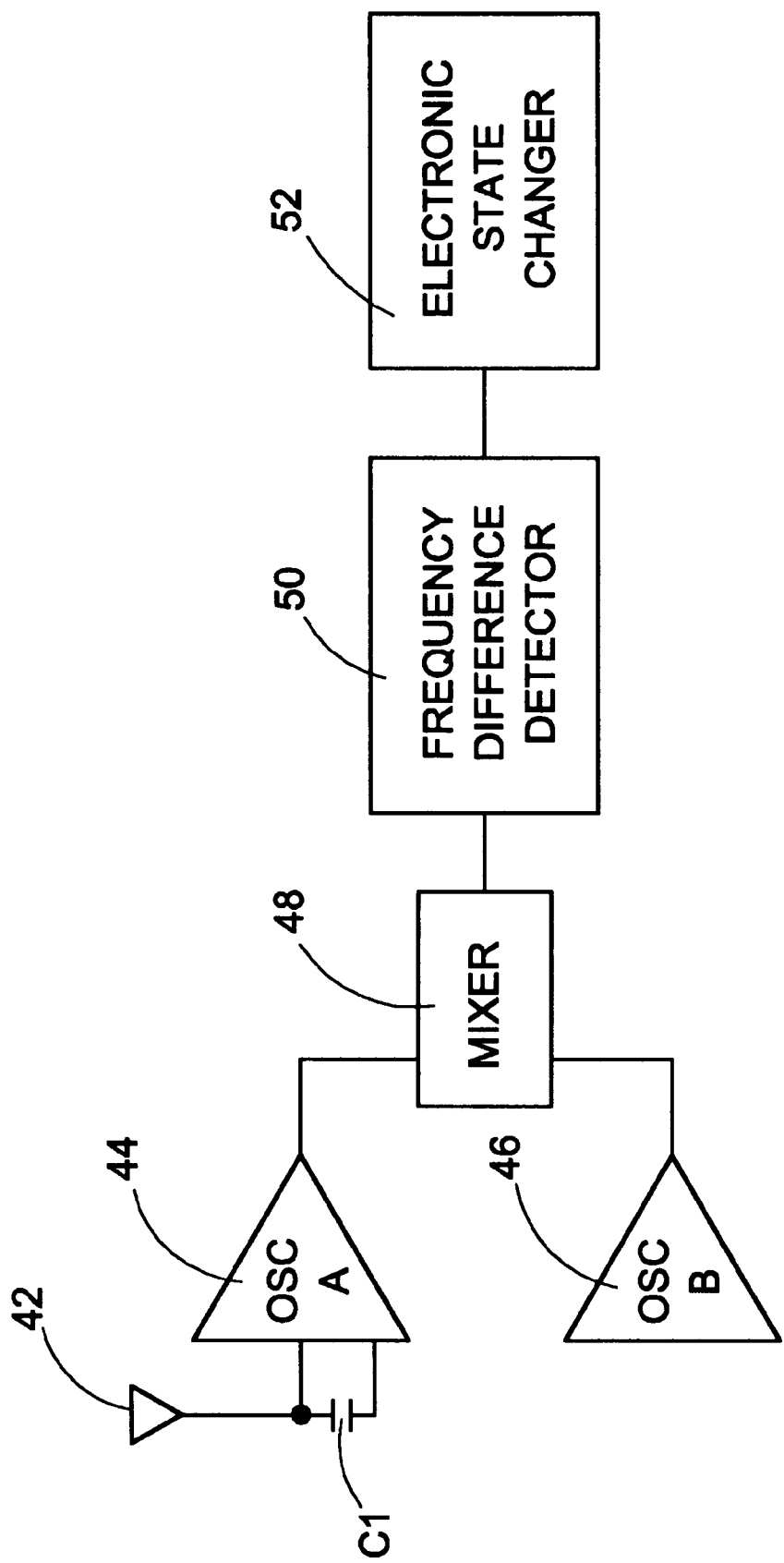
FIG. 7 shows another embodiment of the present invention requiring only one conductive sensing element in the form of a single antenna.
Figure 8:
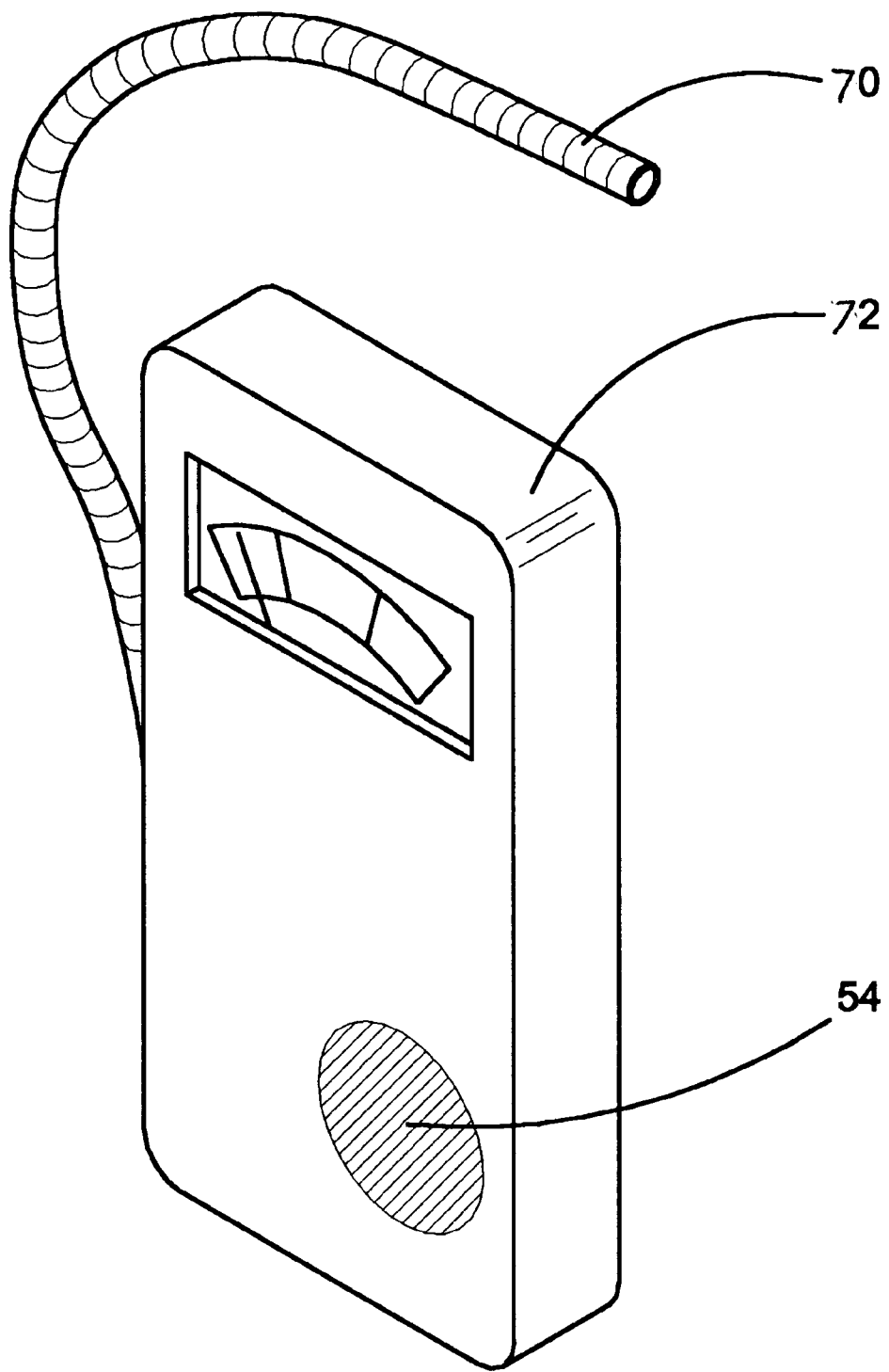
FIG. 8 shows an explosive gas detector having gas leak detector tube 70 coupled to sealed housing 22, and having an internal capacitively operated switch of the present invention inside its housing below area 54.

Another circuit for implementing a non-contact, non-mechanical capacitively coupled switch mechanism is depicted in FIG. 7. This scheme is related to a device known as the Theremin, invented around 1930 by the Russian physicist, Leon Theremin. The Theremin was an early electronic musical instrument which was played without actually touching any part of it. Its tone and loudness were controlled by bringing the hands close to antennae. The slight changes in capacitance between the body and antenna due to the proximity of the person's hand served to operate the device.

In the case of the present invention, long range electronic switching may be accomplished by the capacitive coupling of a human or other conductive object to antenna 42 without actually contacting it. This range may be on the order of a fraction of an inch to about a foot.

Now turning to FIG. 7, a small capacitor C1 which is typically a few picofarads in value is incorporated as a frequency determining element of oscillator 44. Antenna 42 is operatively connected to one leg of capacitor C1 so that when a conductor such as an operator's hand is brought into the vicinity of antenna 42 the capacitive coupling between the operator and antenna 42 will cause the frequency of oscillator 44 to change slightly.

Second oscillator 46 is a fixed frequency oscillator which runs at a frequency close to that of oscillator 44 when nothing is near antenna 42. Typically, oscillators 44 and 46 run at a megahertz or higher. Thus, when very small changes in capacitance on the order of one-tenth picofarads or less are coupled into oscillator 44 due to the presence of a person's hand brought several inches from antenna 42 the frequency change that occurs at the output of oscillator 44 is on the order of tens to hundreds of hertz which is in the audio range of magnitude.

Mixer 48 is a non-linear element for combining the signals from oscillators 44 and 46 so that the output of mixer 48 contains a difference frequency component which is the difference of the frequencies of oscillators 44 and 46. This difference frequency is filtered out by a frequency difference detector 50 such as a low pass filter which may also be designed to amplify the difference signal as is commonly done with IF amplifiers used in radio circuits. The difference signal is then fed into electronic state changer 52 which may be constructed from a frequency to voltage converter and a comparator. The comparator is set to change state between voltage high or low when the difference between the frequencies of oscillators 44 and 46 is sufficiently great. This state change may then be used to turn other electronic devices on and off as desired.

Furthermore, it is to be understood that although the present invention has been described with reference to certain preferred embodiments, various modifications, known to those skilled in the art, may be made to the structures and process steps presented herein without departing from the invention as recited in the several claims appended hereto.

What is claimed is:

1. A switch for actuating an electronic device when an object is moved to a position proximate to said switch, said switch having an on-state and an off-state, comprising:

(A) a first conductor having an electromagnetic field emanating therefrom;

(B) a second conductor that receives said electromagnetic field from said first conductor, said first conductor being separated from said second conductor by a first positive distance;

(C) a detector coupled to said second conductor, said detector sensing variations in a level of said electromagnetic field received by said second conductor;

wherein said level of said electromagnetic field varies a sufficient amount to cause said switch to toggle between said on-state and said off-state when said object is moved to said position proximate to said switch, said position being separated from said first conductor by a second positive distance and from said second conductor by a third positive distance.

2. The switch of claim 1, wherein said object is a conductive object.

3. The switch of claim 2, wherein said conductive object is a finger.

4. The switch of claim 1, wherein said switch is mounted in an interior of a housing.

5. The switch of claim 4, wherein said housing has a thickness, and said second and third positive distances are each equal to or greater than said thickness.

6. The switch of claim 5, wherein said electronic device is a bar code scanner.

7. The switch of claim 6, wherein said housing is in a shape of a gun or wand.

8. The switch of claim 1, further comprising an oscillator coupled to said first conductor, said oscillator introducing a periodic signal into said first conductor.

9. The switch of claim 8, wherein said oscillator has a frequency that is a radio frequency.

10. The switch of claim 8, further comprising an impedance coupling element positioned between said oscillator and said first conductor.

11. The switch of claim 10, wherein said impedance coupling element is a high impedance coupling element.

12. The switch of claim 8, wherein said oscillator is formed from a CMOS circuit element.

13. The switch of claim 1, wherein said first and second conductors are affixed to a non-conductive substrate.

14. The switch of claim 13, wherein said substrate is formed from a circuit board.

15. The switch of claim 1, wherein said first and second conductors are formed from copper foil.

16. The switch of claim 1, wherein said first and second conductors each have a length equal to about ⅛ of an inch.

17. The switch of claim 1, further comprising an amplifier coupled to said second conductor.

18. The switch of claim 17, wherein said amplifier is formed from at least one CMOS circuit element.

19. The switch of claim 18, wherein said amplifier is formed of a plurality of CMOS circuit elements coupled in series.

20. The switch of claim 17, further comprising an impedance coupling element positioned between said amplifier and said second conductor.

21. The switch of claim 20, wherein said impedance coupling element is a high impedance coupling element.

22. The switch of claim 17, further comprising a detector coupled to an output of said amplifier.

23. The switch of claim 22, wherein said detector is formed from a diode.

24. The switch of claim 22, further comprising a level switch coupled to an output of said detector.

25. The switch of claim 24, wherein said level switch is formed from a comparator.

26. The switch of claim 22, further comprising an AC amplifier coupled to said detector to form a motion detector, said motion detector having an output coupled to a level switch.

27. The switch of claim 1, further comprising a passive conductor positioned between said first and second conductors.

28. The switch of claim 1, wherein said first and second conductors are flat.

29. The switch of claim 1, wherein said first and second conductors are curved.

30. The switch of claim 1, wherein said first and second conductors are affixed to a non-conductive substrate surface, and at least one of said first and second conductors is positioned at a positive non-zero angular orientation with respect to said substrate surface.

* * * * *